US008592911B2

(12) United States Patent
Liang et al.

(10) Patent No.: US 8,592,911 B2
(45) Date of Patent: Nov. 26, 2013

(54) ASYMMETRIC SEMICONDUCTOR DEVICE HAVING A HIGH-K/METAL GATE AND METHOD OF MANUFACTURING THE SAME

(75) Inventors: Qingqing Liang, Beijing (CN); Huicai Zhong, Beijing (CN); Huilong Zhu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/063,717

(22) PCT Filed: Sep. 25, 2010

(86) PCT No.: PCT/CN2010/077285
§ 371 (c)(1),
(2), (4) Date: Mar. 11, 2011

(87) PCT Pub. No.: WO2011/113270
PCT Pub. Date: Sep. 22, 2011

(65) Prior Publication Data
US 2011/0227160 A1    Sep. 22, 2011

(30) Foreign Application Priority Data
Mar. 17, 2010  (CN) .......................... 2010 1 0129453

(51) Int. Cl.
*H01L 29/78*    (2006.01)

(52) U.S. Cl.
USPC ............ 257/356; 257/E29.255; 257/E21.409; 438/286

(58) Field of Classification Search
USPC ............ 257/356, E29.255, E21.409; 438/286
See application file for complete search history.

(56) References Cited

U.S. PATENT DOCUMENTS

| | | | | |
|---|---|---|---|---|
| 5,256,585 A  * | 10/1993 | Bae | ................................ | 438/304 |
| 2004/0248356 A1* | 12/2004 | Dokumaci et al. | ............ | 438/216 |
| 2008/0258225 A1* | 10/2008 | Yang et al. | ..................... | 257/364 |
| 2009/0218627 A1* | 9/2009 | Zhu | ................................ | 257/368 |
| 2010/0059833 A1* | 3/2010 | Yu et al. | ........................ | 257/410 |
| 2010/0289085 A1* | 11/2010 | Yuan et al. | ..................... | 257/369 |

* cited by examiner

*Primary Examiner* — Marc Armand
(74) *Attorney, Agent, or Firm* — Troutman Sanders LLP

(57) ABSTRACT

A semiconductor device and a method of manufacturing the same are provided. The semiconductor device has a metal sidewall spacer on the sidewall of a gate electrode on the drain region side. The metal sidewall spacer is made of such metals as Ta, which has an oxygen scavenging effect and can effectively reduce EOT on the drain region side, and thus the ability to control the short channel is effectively increased. In addition, since EOT on the source region side is larger, the carrier mobility of the device will not be degraded. Moreover, such asymmetric device may have a better driving performance.

9 Claims, 10 Drawing Sheets

ASYMMETRIC SEMICONDUCTOR DEVICE HAVING A HIGH-K/METAL GATE AND METHOD OF MANUFACTURING THE SAME

BENEFIT CLAIMS

This application is a US National Stage of International Application No. PCT/CN2010/077285, filed Sep. 25, 2010, which claims the benefit of CN 201010125493.6, filed Mar. 17, 2010.

FIELD OF THE INVENTION

The present invention generally relates to a semiconductor device and a method of manufacturing the same, and particularly, to an asymmetric semiconductor device having a high-k/metal gate which can reduce the Equivalent Oxide Thickness (EOT) on a drain side and a method of manufacturing the same.

DESCRIPTION OF THE PRIOR ART

Nowadays, gate engineering for CMOS devices focusing on the "high-k gate dielectric/metal gate" technology is the most typical core process in the 32/22 nm technology, and researches on the relevant materials, processes and structures have been made extensively. Intel has disclosed that the leakage current of the device is reduced significantly by using the high-k gate dielectric material. Nevertheless, in the high-k metal gate process, the high temperature annealing process that must be adopted during the process integration causes the interface layer between the high-k dielectric material and the substrate to become thicker during the annealing process. The thick interface layer increases the EOT of the device, thus reducing the ability to control the short channel effect.

In addition, in the high-k dielectric, the mobility reduces with the reduction of the EOT due to the influences from such effects as the remote Coulomb scattering, which results in a reduced driving current of the device.

Hence, there is a need to provide a semiconductor device that can effectively control the short channel effect without degrading the device performance and a method of manufacturing the same.

SUMMARY OF THE INVENTION

The present invention provides a semiconductor device. The semiconductor device comprises: a semiconductor substrate; a gate stack formed on the semiconductor substrate, the gate stack comprising an interface layer, a gate dielectric layer and a gate electrode; a source region and a drain region formed in the semiconductor substrate on the respective sides of the gate stack; a metal sidewall spacer formed on the gate dielectric layer on the drain region side. The metal sidewall spacer is formed of one selected from a group comprising Ta, Al, and a combination thereof. The thickness of the metal sidewall spacer ranges from about 20 angstroms to 50 angstroms.

The present invention also provides a method of manufacturing the semiconductor device. The method comprises the steps of: providing a semiconductor substrate; forming a gate stack on the semiconductor substrate, the gate stack comprising an interface layer, a gate dielectric layer and a gate electrode; forming a metal sidewall spacer on the sidewall on one side of the gate electrode, the metal sidewall spacer being located on the gate dielectric layer; forming a second sidewall spacer on the sidewalls of the gate stack and the metal sidewall spacer; forming a source region and a drain region in the semiconductor substrate on the respective sides of the gate dielectric layer, the drain region being located in the semiconductor substrate on the side where the gate dielectric layer has the metal sidewall spacer thereon. The step of forming the metal sidewall spacer comprises: forming a metal sidewall spacer on the sidewall of the gate electrode, and forming a first sidewall spacer on the sidewall of the metal sidewall spacer; performing an angled heavy ion implantation to damage the part of the first sidewall spacer on one side; removing the first sidewall spacer and the metal sidewall spacer on the side of the damaged part of the first sidewall spacer; and removing the part of the first sidewall spacer on the other side. The metal sidewall spacer is formed of one selected from a group comprising Ta, Al, and a combination thereof. The thickness of the metal sidewall spacer ranges from about 20 angstroms to 50 angstroms.

The present invention also provides another method of manufacturing the semiconductor device. The method comprises the steps of: providing a semiconductor substrate; forming a gate stack on the semiconductor substrate, the gate stack comprising an interface layer, a gate dielectric layer and a gate electrode; forming a metal sidewall spacer on the sidewall on one side of the gate electrode, and forming a first sidewall spacer on the sidewall of the metal sidewall spacer, the metal sidewall spacer and the first sidewall spacer being located on the gate dielectric layer; forming a second sidewall spacer on the sidewalls of the gate stack and the first sidewall spacer; forming a source region and a drain region in the semiconductor substrate on the respective sides of the gate dielectric layer, the drain region being located in the semiconductor substrate on the side where the gate dielectric layer has the metal sidewall spacer thereon. The step of forming the metal sidewall spacer and the first sidewall spacer comprises: forming a metal sidewall spacer on the sidewall of the gate electrode, and forming a first sidewall spacer on the sidewall of the metal sidewall spacer; performing an angled heavy ion implantation to damage the part of the first sidewall spacer on one side; removing the first sidewall spacer and the metal sidewall spacer on the side of the damaged part of the first sidewall spacer. The metal sidewall spacer is formed of one selected from a group comprising Ta, Al, and a combination thereof. The thickness of the metal sidewall spacer ranges from about 20 angstroms to 50 angstroms.

The present invention also provides a method of manufacturing a common-source semiconductor device. The method comprises the steps of: providing a semiconductor substrate; forming an interface layer, a gate dielectric layer, a first gate layer and a sacrifice layer in this order on the semiconductor substrate, and performing photolithography on the sacrifice layer; forming a second gate layer on the sidewall of the sacrifice layer, the second gate layer being located on the first gate layer; forming a metal sidewall spacer on the sidewalls of the first and second gate layers, the metal sidewall spacer being located on the gate dielectric layer; removing the sacrifice layer and the part of the first gate layer thereunder as well as the parts of the gate dielectric layer and the interface layer that are not covered by the second gate layer and the metal sidewall; forming a second sidewall spacer on the sidewalls of the metal sidewall spacer and the first and second gate layers; forming a source region and a drain region in the semiconductor substrates on respective sides of the gate dielectric layer, the drain region being located in the semiconductor substrate on the side where the gate dielectric layer has the metal sidewall spacer thereon. The metal sidewall spacer is formed of one selected from a group comprising Ta, Al, and a combination thereof. The thickness of the metal sidewall spacer ranges from about 20 angstroms to 50 angstroms.

By means of the semiconductor device of the present invention, the metal sidewall spacer is formed on the sidewall of the gate electrode on the drain region side and on the gate dielectric layer. The metal sidewall spacer has an oxygen scavenging effect, which effectively reduces EOT on the drain region side, thus the ability to control the short channel effect is effectively increased. Moreover, since EOT on the source region side is larger, the carrier mobility of the device will not be degraded.

DETAILED DESCRIPTION OF THE INVENTION

Figure 1:
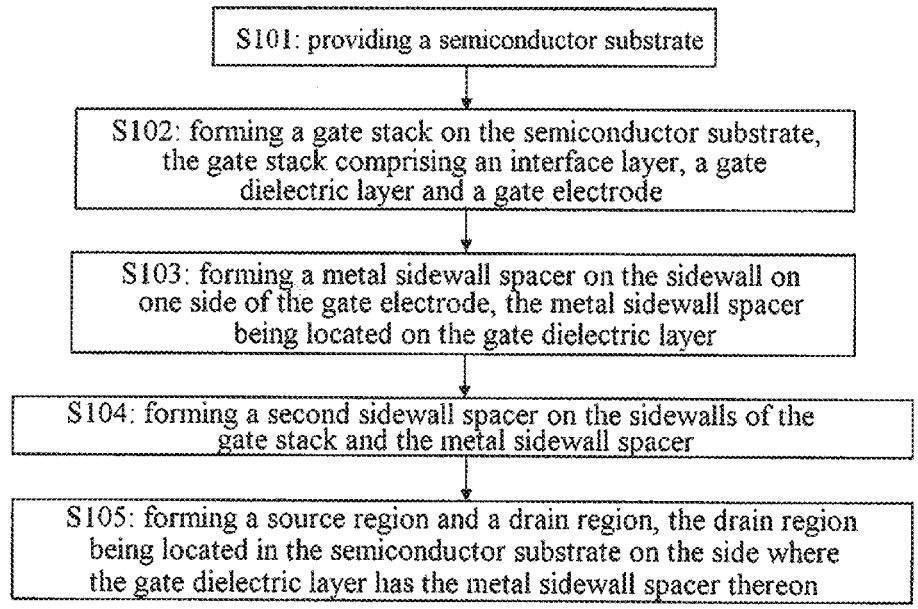
FIG. 1 shows a flow chart of a method for manufacturing a semiconductor device according to a first embodiment of the present invention.

The present invention generally relates to a method of manufacturing a semiconductor device. The following disclosure provides many different embodiments or examples for realizing different structures of the present invention. To simplify the disclosure of the present invention, the components and configuration of specific examples are described in the following. Of course, they are merely examples and are not intended to limit the invention. In addition, reference numerals and/or letters can be repeated in different examples in the present invention, and such repetition is for the purpose of concision and clarity, which in itself does not discuss the relationship between the various embodiments and/or configurations. Furthermore, the present invention provides examples of various specific techniques and materials, but those skilled in the art will be aware of the applicability of other techniques and/or materials. Moreover, the structure in which the first element is "above" the second element as described below may include the embodiment where the first and second elements are formed to be in direct contact, or it may also include the embodiment where a further element is formed between the first and second elements, in which case the first and second elements may not be in direct contact.

Figure 8:
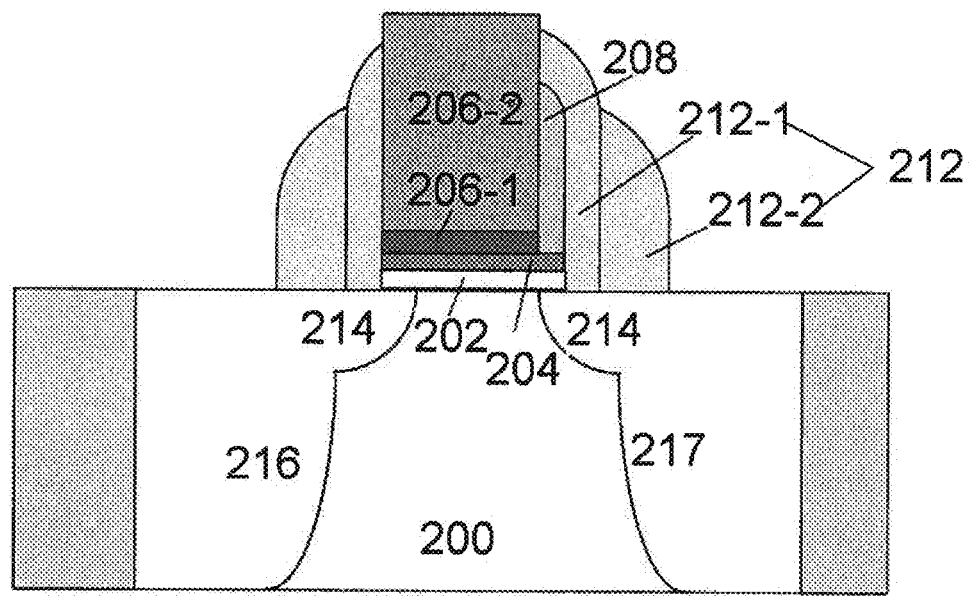

Reference is now made to FIG. 8, which shows the structure of the semiconductor device of the present invention. The device comprises: an interface layer 202; a gate dielectric layer 204; a gate electrode 206; a metal sidewall spacer 208 on the sidewall of the gate electrode 206 and located on the gate dielectric layer 204, the metal sidewall spacer 208 being formed of such metals as Ta, Al, etc., and having an oxygen scavenging effect; and active regions 216 and 217 in the semiconductor substrate on the both sides of the gate dielectric layer 204, wherein the active region on the metal sidewall spacer 208 side being defined as a drain region 217, and the active region on the other side being defined as a source region 216. The metal sidewall spacer 208 may scavenge the oxygen ions in the interface layer between the gate dielectric layer 204 and the substrate 200, thus effectively reducing the thickness of this dielectric layer, and hence the EOT on the drain region side. The manufacturing method according to various embodiments of the present invention will be described below in detail.

First Embodiment

Figure 2:
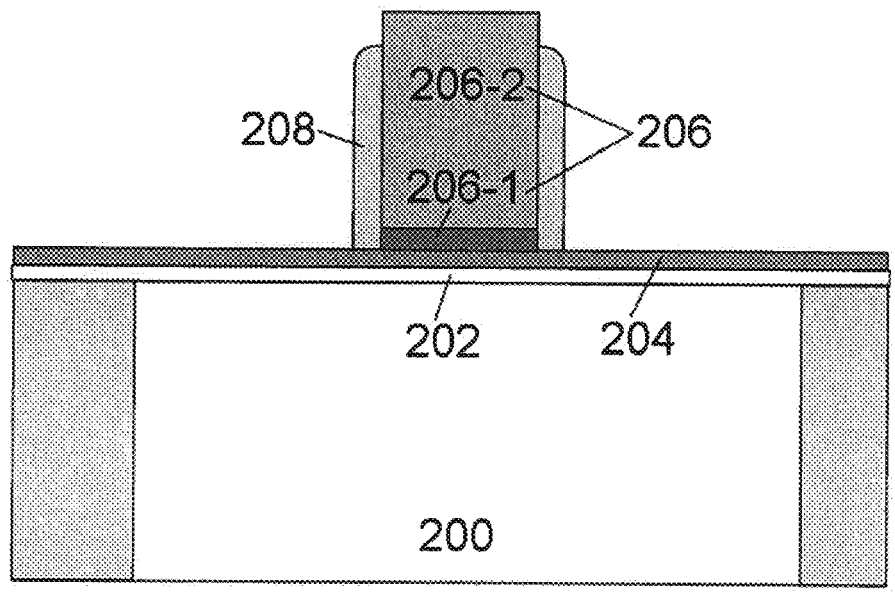
FIGS. 2-9 schematically illustrate the semiconductor device in the respective manufacturing stages according to the first embodiment of the present invention.

Reference now is made to FIG. 1, which shows a flow chart of the method of manufacturing a semiconductor device according to the first embodiment of the present invention. In step S101, a semiconductor substrate is provided, as shown in FIG. 2. In the present invention, the substrate 200 comprises a silicon substrate (e.g. a wafer) in a crystal structure. The substrate 200 may also comprise other basic semiconductors or compound semiconductors, such as Ge, SiGe, GaAs, InP, SiC, diamond or the like. According to the design requirements (e.g. a p-type substrate or an n-type substrate) known in the prior art, the substrate 200 may comprise various doping configurations. In addition, the substrate 200 may optionally comprise an epitaxial layer which can be manipulated by stress to enhance its performance, and may optionally comprise a Silicon-On-Insulator (SOI) structure.

Figure 5:
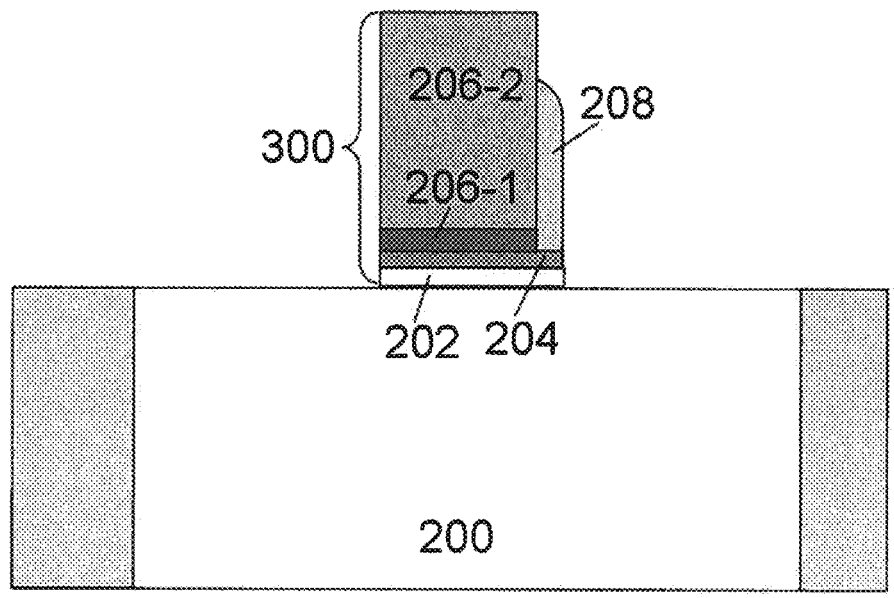

In steps S102 and S103, a gate stack 300 is formed on the semiconductor substrate 200, which comprises an interface layer 202, a gate dielectric layer 204, and a gate electrode 206. A metal sidewall spacer 208 is formed on the sidewall on one side of the gate electrode 206, the metal sidewall spacer 208 being located on the gate dielectric layer 204, as shown in FIG. 5.

Specifically, first, the interface layer 202, the gate dielectric layer 204, and the gate electrode 206 are formed in this order on the semiconductor substrate 200. Then the gate electrode 206 is patterned, and the metal sidewall spacer 208 is formed on the sidewall of the gate electrode 206, as shown in FIG. 2. The interface layer 202 can be $SiO_2$, and can be formed by thermal growth. The gate dielectric layer 204 is a high-k dielectric material (e.g. a material with a higher dielectric constant as compared to silicon oxide). Examples of the high-k dielectric material include, for example, hafnium-based materials, such as $HfO_2$, HfSiO, HfSiON, HfTaO, HfSiO, or HfZrO, or any combination thereof and/or other appropriate materials. The gate electrode 206 may be a multi-layer structure, and may comprise metals, metal compound, polysilicon, or metal silicide, or any combination thereof. In an embodiment of the present invention, the gate electrode 206 is a two-layer structure, which comprises a first gate layer 206-1 of metals and a second gate layer 206-2 of polysilicon. The metal sidewall spacer 208 can be formed of Ta, Al or the like, or any combination thereof, with the thickness thereof being about 20 angstroms to 50 angstroms. Deposition of the gate dielectric layer 204 and the gate electrode 206 can be performed by such methods as sputtering, Pulsed Laser Deposition (PLD), Metal Oxide Chemical Vapor Deposition (MOCVD), Atomic Layer Deposition (ALD), Plasma Enhanced Atomic Layer Deposition (PEALD), or other appropriate methods.

Figure 3:
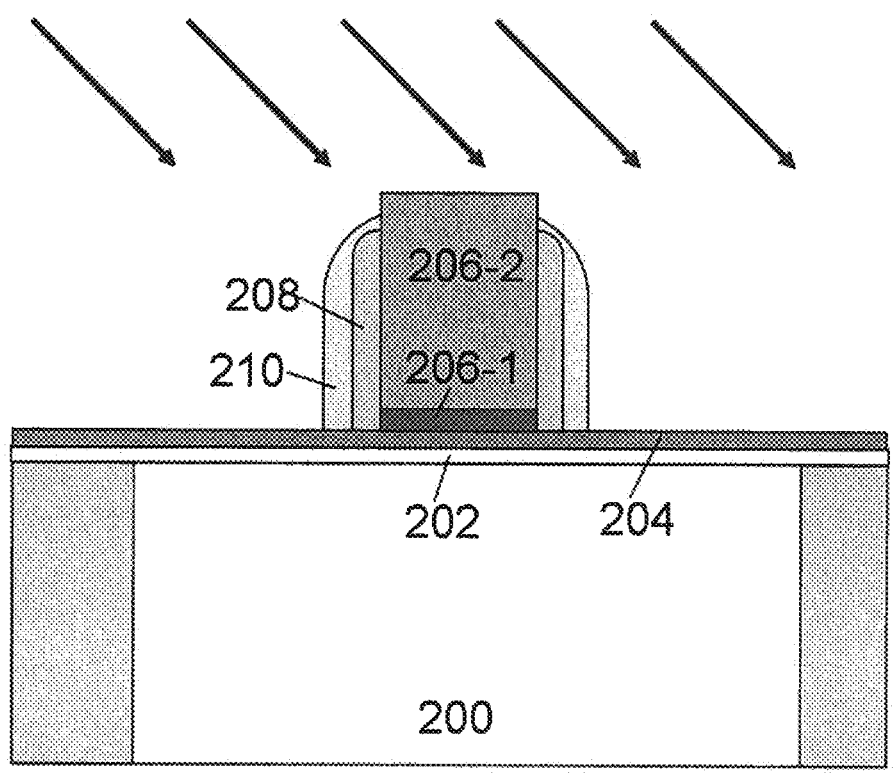

Then, a first sidewall spacer 210 is formed on the sidewall of the metal sidewall spacer 208, and an angled heavy ion implantation is performed, as shown in FIG. 3. The first sidewall spacer 210 is formed of a nitride material, such as SiN, etc. Ions used for the heavy ion implantation can be such ions as Xe and Ge having larger atomic weight, of which the energy ranges from 50 KeV to 200 KeV. After performing the heavy ion implantation, one side of the first sidewall spacer 210 is damaged to a certain extent. Taking the heavy ion implantation in the direction shown by the arrow in FIG. 3 as an example, the part of the first sidewall spacer 210 on the left side is damaged while the part thereof on the right side is intact.

Figure 4:
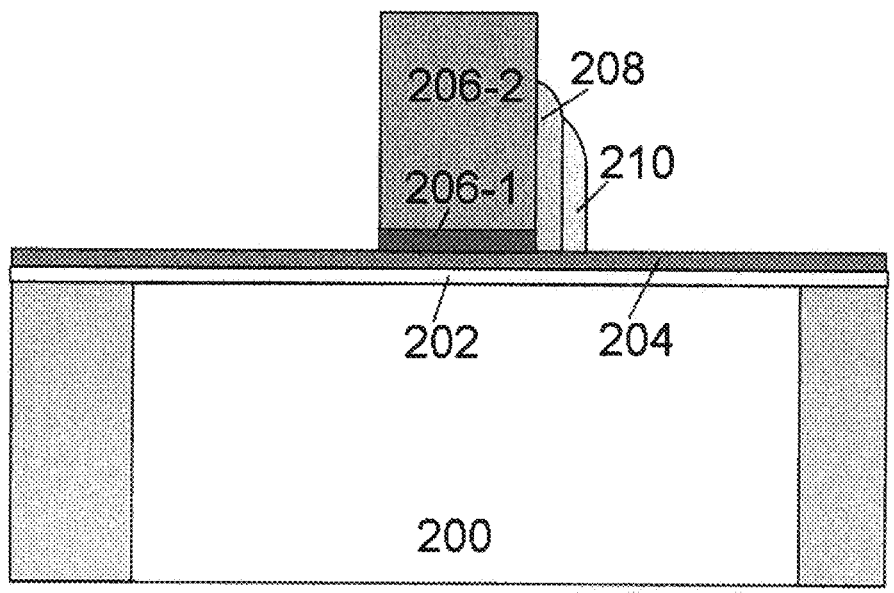

Afterwards, the first sidewall spacer 210 and the metal sidewall spacer 208 are selectively etched to form the structure as shown in FIG. 4. An etching process, such as Dilute HF (DHF), Buffered HF (BHF), or the like, that has lower etching rate to the intact part of the first sidewall spacer 210, may be selected. The first sidewall spacer 210 has been damaged on one side to a certain extent during the heavy ion implantation, that is, the part of the first sidewall spacer 210 on the left side is damaged and the part thereof on the right side is intact as shown in the figures of the present embodiment, as described above. Therefore, during the etching, the part of the first sidewall spacer 210 on the left side has a faster etching rate. As a result, the part of the first sidewall spacer 210 on the left side is etched away, and the part of the metal sidewall spacer 208 on the left side is further removed by the etching. Meanwhile, only a small part of the first sidewall spacer 210 on the right side is etched away and the part of the metal sidewall spacer 208 on the right side is retained under the protection of the first sidewall spacer 210 on the right side, thereby forming the structure as shown in FIG. 4.

After that, the remaining part of the first sidewall spacer 210 as well as the parts of the gate dielectric layer 204 and the interface layer 202 that are not covered by the gate electrode 206 and the metal sidewall spacer 208 is removed by selectively etching, so as to form a gate stack 300, as shown in FIG. 5.

Figure 6:
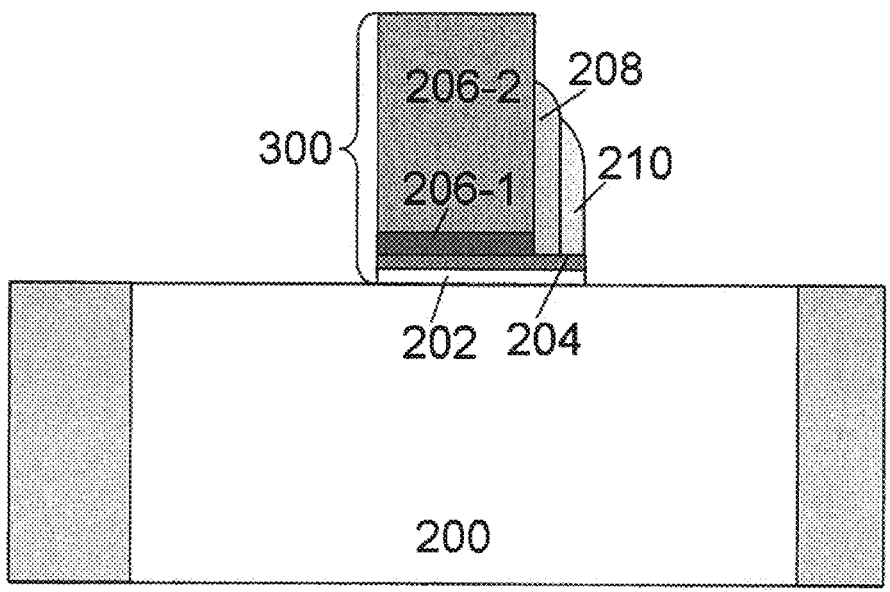

Alternatively, the remaining part of first sidewall spacer 210 may not be removed, and the parts of the gate dielectric layer 204 and the interface layer 202 that are not covered by the gate electrode 206, the first sidewall spacer 210 and the metal sidewall spacer 208 are removed by selectively etching, so as to form the structure as shown in FIG. 6.

Figure 7:
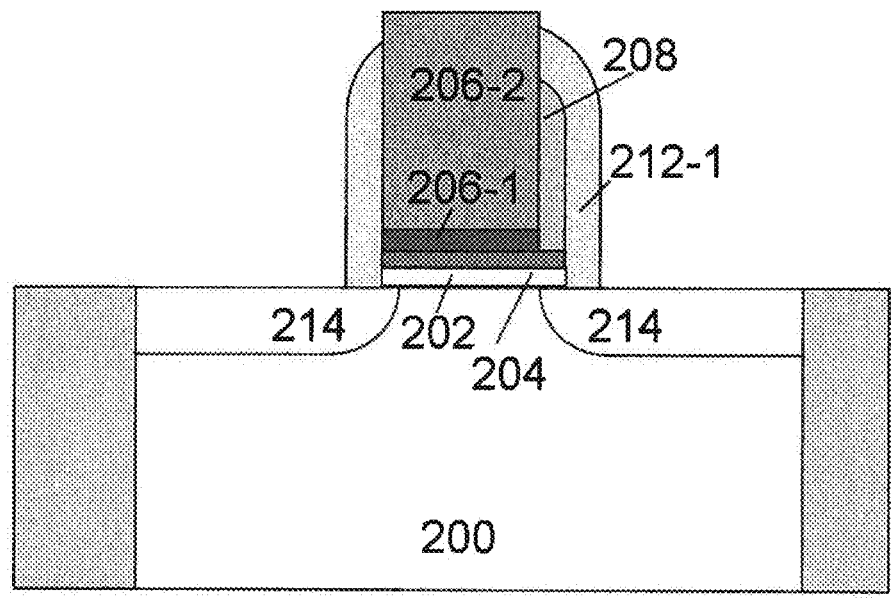

In step S104, a second sidewall spacer 212 is formed on the sidewalls of the gate stack 300 and the metal sidewall spacer 208, as shown in FIG. 8. The second sidewall spacer 212 can be a multi-layer structure, and may be formed of silicon nitride, silicon oxide, silicon oxynitride, silicon carbide, fluoride-doped silicon glass, or low-k dielectric materials, or any combination thereof, and/or other appropriate materials. In this embodiment of the present invention, the second sidewall spacer 212 is a two-layer structure. A first layer 212-1 of the second sidewall spacer 212, such as SiN, is formed firstly, as shown in FIG. 7. After forming the first layer 212-1, a source/drain shallow junction region 214 may be formed. The source/drain shallow junction region 214 generally comprises a source/drain extension and/or halo implantation, which may be formed by implanting p-type or n-type dopants or impurity into the substrate 200 according to the desired transistor structure. Then a second layer 212-2 of the second sidewall spacer 212, such as silicon oxide, is formed. The structure of the sidewall spacer 212 can be obtained using processes known by those skilled in the art.

In step S105, a source region 216 and a drain region 217 are formed, and the drain region 217 is located in the semiconductor substrate 200 on the side where the metal sidewall spacer 208 is located on the gate dielectric layer 204, as shown in FIG. 8. The source region 216 and the drain region 217 can be formed by methods including photolithography, ion implantation, diffusion and/or other appropriate processes.

Figure 9:
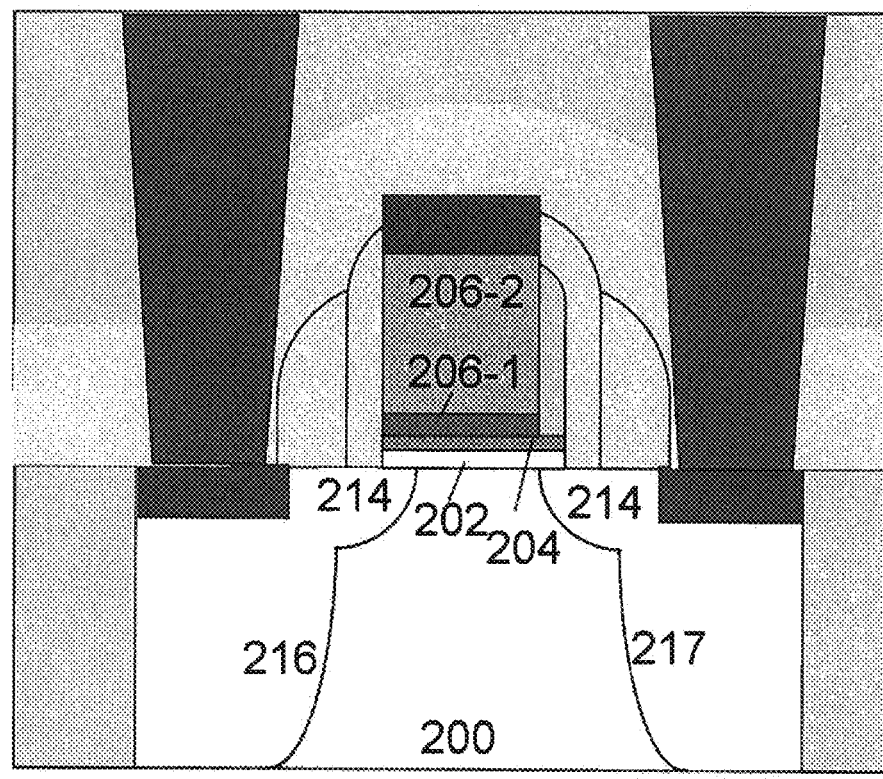

Then, subsequence processing steps are performed on the device, as shown in FIG. 9. A metal silicide layer is formed on the source region 216, the drain region 217, and the polysilicon layer 206-2 of the gate electrode 206. A source contact and a drain contact are formed on the metal silicide layer. The contacts may be formed by means of such conventional processes as photolithography, deposition and planarization, etc., which are obvious to those skilled in the art.

The above describes the method of manufacturing a semiconductor device that reduces EOT on the drain region side by means of the metal sidewall spacer on the gate dielectric layer on the drain region side. According to the first embodiment of the present invention, the metal sidewall spacer is formed of such metals as Ta on the gate dielectric layer on the drain region side, and has an oxygen scavenging effect, so it can scavenge the oxygen ions in the interface layer and in the thickened interface layer due to the high temperature annealing. Hence, EOT on the drain region side is effectively reduced and the ability to control the short channel effect is effectively increased. Moreover, since EOT on the source region side is larger, the carrier mobility of the device will not be degraded.

Second Embodiment

The following will only describe the aspects of the second embodiment that are different from those of the first embodiment, while the parts not described should be considered as being carried out using the same steps, methods or processes as those in the first embodiment, and thus will not be repeated here.

Figure 10:
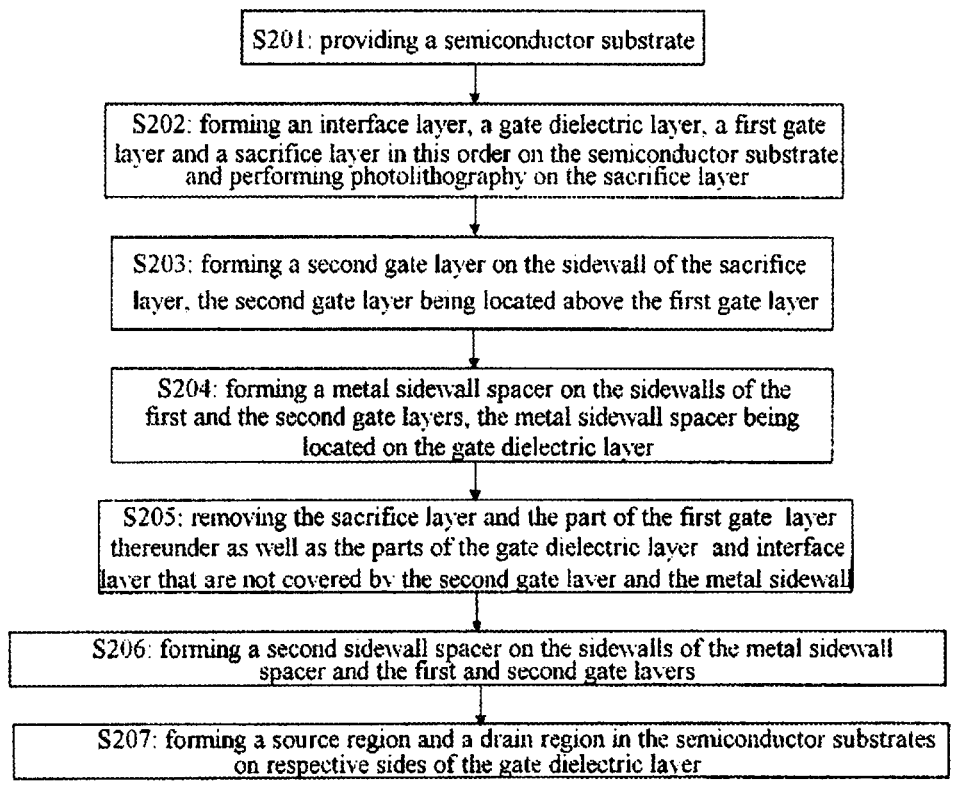
FIG. 10 shows a flow chart of a method for manufacturing a semiconductor device according to a second embodiment of the present invention.
Figure 12:
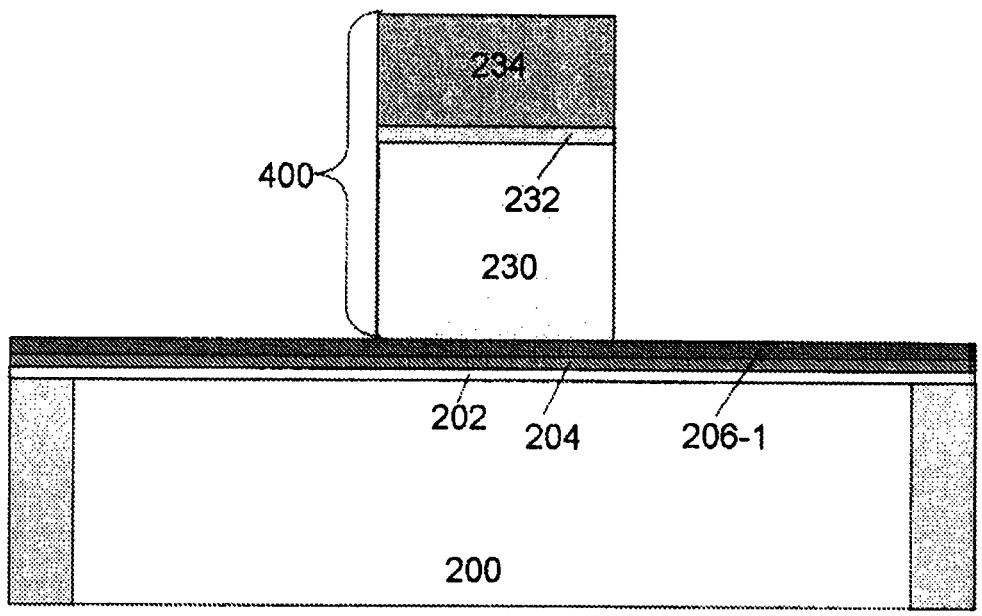

Reference now is made to FIG. 10, which shows a flow chart of the method for manufacturing a common-source semiconductor device according to an embodiment of the present invention. In step S202, an interface layer 202, a gate dielectric layer 204, a first gate layer 206-1 and a sacrifice layer 230 are formed in this order on the semiconductor substrate 200, and photolithography is performed on the sacrifice layer, as shown in FIG. 12.

Figure 11:
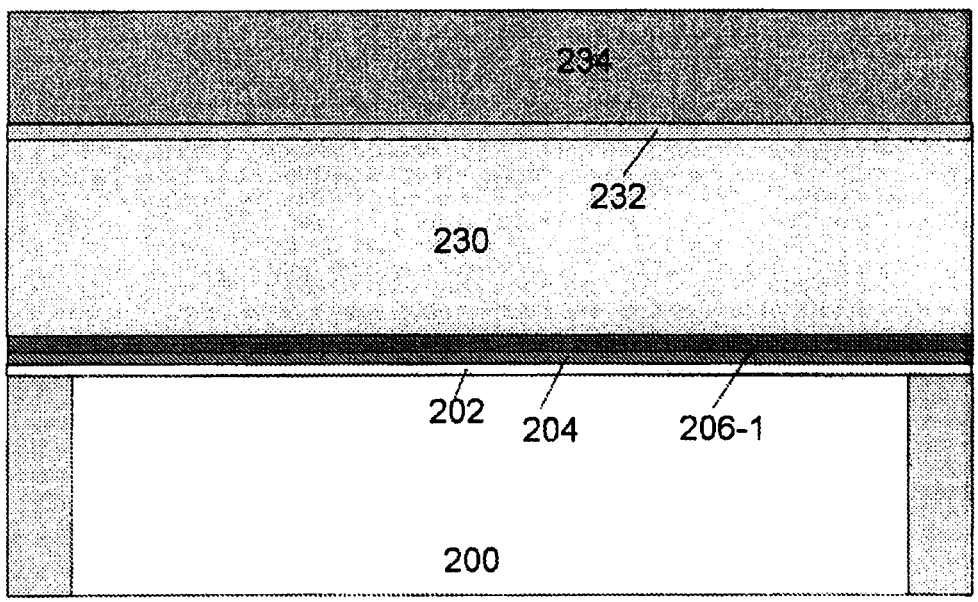
FIGS. 11-19 schematically illustrate the semiconductor device in the respective manufacturing stages according to the second embodiment of the present invention.

Specifically, the interface layer 202, the gate dielectric layer 204, the first gate layer 206-1, the sacrifice layer 230, a first stop layer 232 and a second stop layer 234 are formed in this order on the semiconductor substrate 200, as shown in FIG. 11. The interface layer 202 can be formed of $SiO_2$ by thermal growth. The gate dielectric layer 204 is formed of a high-k material (e.g. a material with a higher dielectric constant as compared to silicon oxide). Examples of the high-k dielectric material comprise, for example, hafnium-based materials, such as $HfO_2$, HfSiO, HfSiON, HfTaO, HfSiO, or HfZrO, or any combination thereof, and/or other appropriate materials. The first gate layer 206-1 can be a metal or a metal compound. The sacrifice layer can be formed of a nitride material, such as SiN, etc. The first stop layer 232 can be formed of an oxide material, such as $SiO_2$, etc. The second stop layer 234 can be formed of a semiconductor material, such as polysilicon, etc. Deposition of the gate dielectric layer 204, the first gate layer 206-1, the sacrifice layer 230, the first stop layer 232 and the second stop layer 234 can be formed by such methods as sputtering, PLD, MOCVD, ALD, PEALD or other appropriate methods. Then the sacrifice layer 230, the first stop layer 232, and the second stop layer 234 are patterned by photolithography to form a sacrifice stack 400, as shown in FIG. 12.

Figure 15:
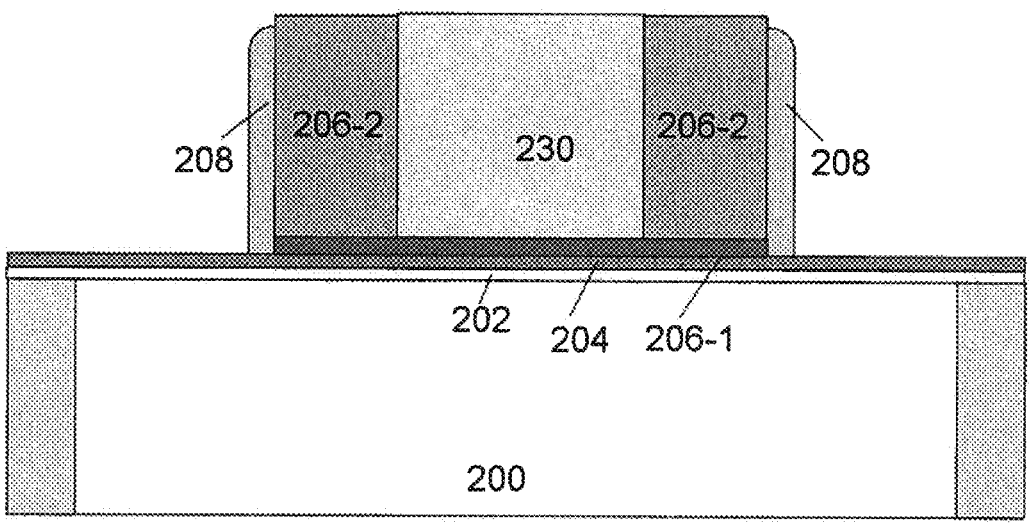

In step S203, a second gate layer 206-2 is formed on the sidewall of the sacrifice layer 230, and the second gate layer 206-2 is located on the first gate layer 206-1, as shown in FIG. 15.

Figure 13:
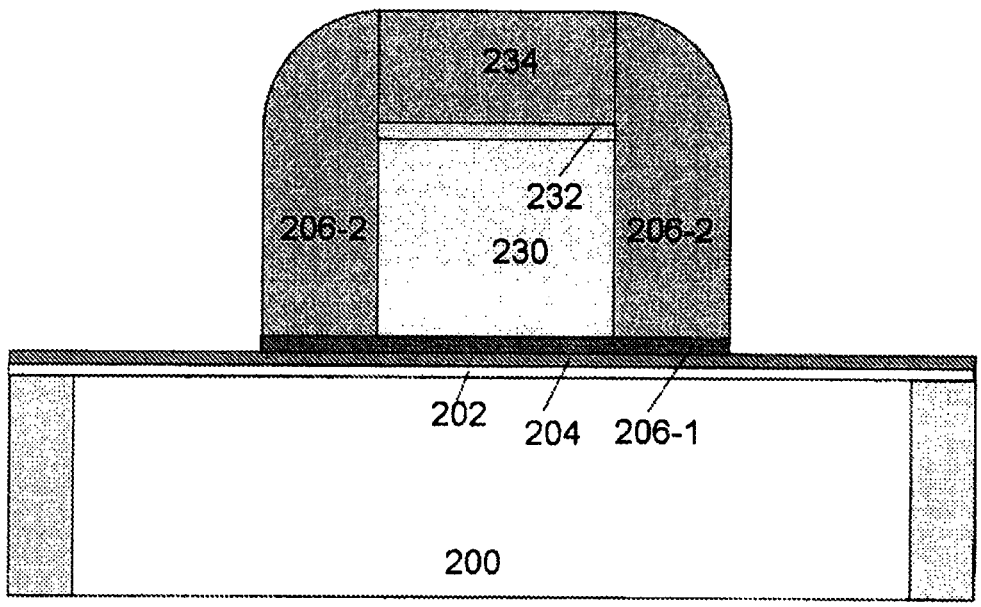
Figure 14:
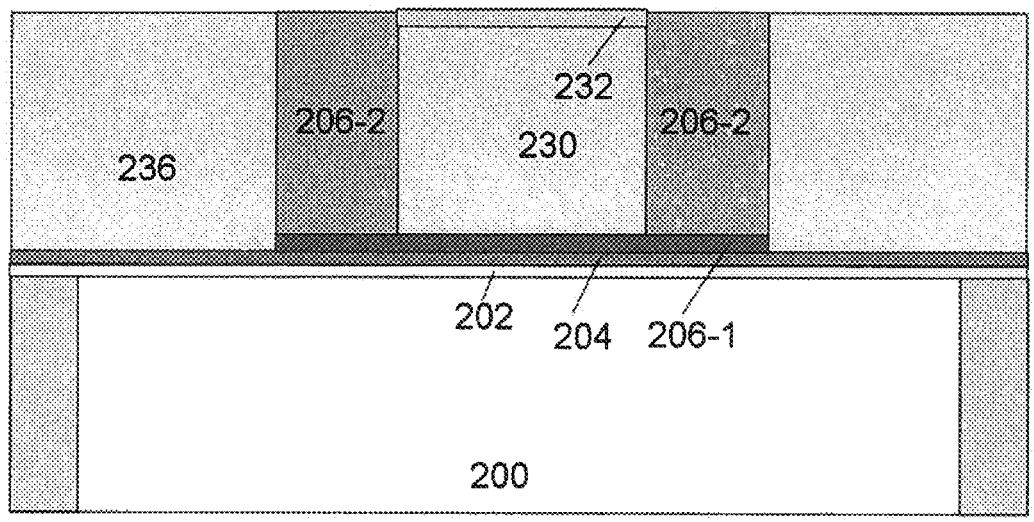

Specifically, the second gate layer 206-2 is formed on the sidewall of the sacrifice stack 400, and the exposed portion of the first gate layer 206-1 is removed by means of RIE, as shown in FIG. 13. The second gate layer 206-2 can be formed of polysilicon. Afterwards, a planarization layer 236 is formed to cover the device, and Chemical Mechanical Polishing (CMP) is carried out to remove the planarization layer 236 and the first stop layer 232 on the sacrifice stack 400 to expose the second stop layer 234, as shown in FIG. 14. Then, the second stop layer 234 and the planarization layer 236 are removed by means of RIE, as shown in FIG. 15.

In step S204, a metal sidewall spacer 208 is formed on the sidewalls of the first gate layer 206-1 and the second gate layer 206-2, as shown in FIG. 15. The metal sidewall spacer 208 can be formed of Ta, Al, etc., or a combination thereof, and has a thickness of about 20 angstroms to 50 angstroms. The metal sidewall spacer has an oxygen scavenging effect.

Figure 16:
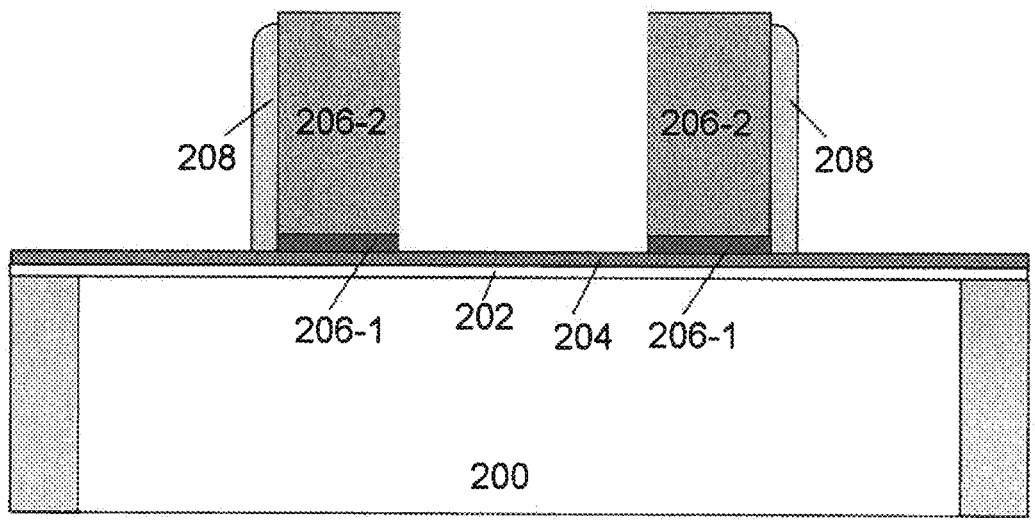
Figure 17:
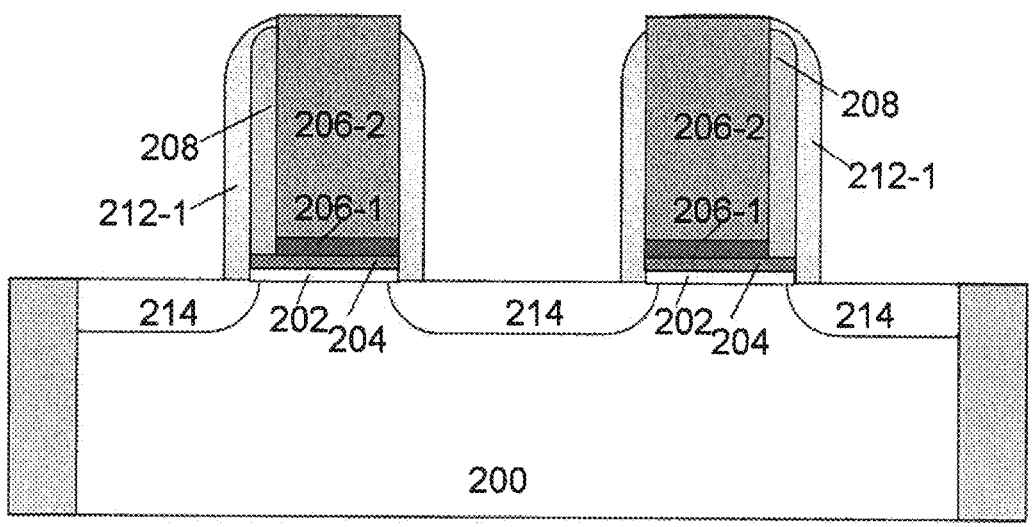

In step S205, the sacrifice layer 203 and the part of the first gate layer 206-1 thereunder, as well as the parts of the gate dielectric layer 204 and interface layer 202 that are not covered by the second gate layer 206-2 and the metal sidewall spacer 208 are removed, as shown in FIG. 17. First, the sacrifice layer 230 and the part of the first gate layer 206-1 thereunder are removed by selectively etching, as shown in FIG. 16. Then the parts of the gate dielectric layer 204 and the interface layer 202 that are not covered by the second gate layer 206-2 and the metal sidewall spacer 208 are removed by a further etching, thereby forming the gate stack structure of the common-source semiconductor device, as shown in FIG. 17.

Figure 18:
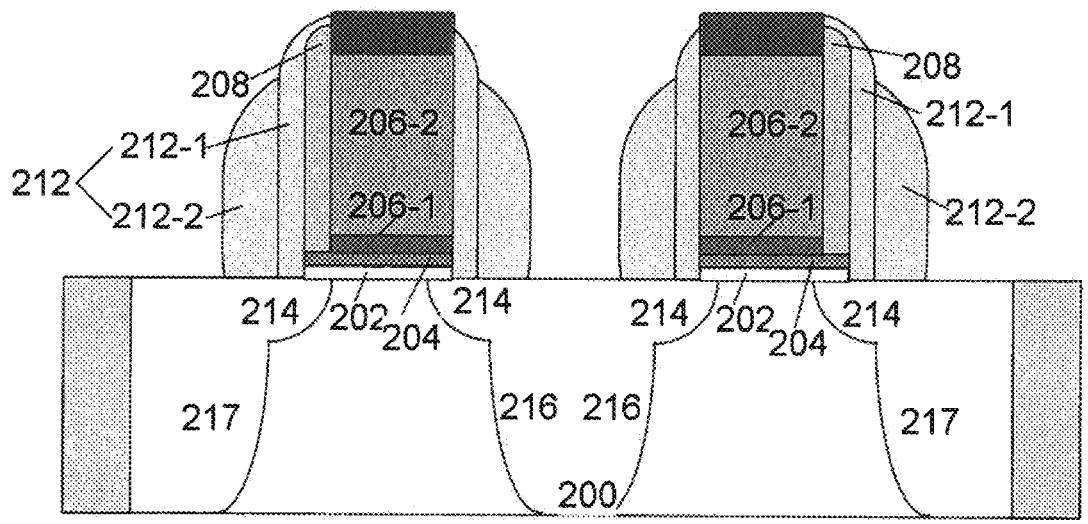

In step S206, a second sidewall spacer 212 is formed on the sidewalls of the metal sidewall spacer 208, the first gate layer 206-1 and the second gate layer 206-2, as shown in FIG. 18. The second sidewall spacer 212 can be a multi-layer structure, and may be formed of silicon nitride, silicon oxide, silicon oxynitride, silicon carbide, fluoride-doped silicon glass, or low-k dielectric material, or any combination thereof, and/or other appropriate materials. In an embodiment of the present invention, the second sidewall spacer 212 is a two-layer structure, and a first layer 212-1 of the second sidewall spacer 212, such as SiN, is formed first, as shown in FIG. 17. After forming the first layer 212-1, a source/drain shallow junction region 214 may be formed. The source/drain shallow junction region 214 generally comprises a source/drain extension and/or a halo implantation, which may be formed by implanting p-type or n-type dopants or impurity into the substrate 200 according to the desired transistor structure. Then, a second layer 212-2 of the second sidewall spacer 212, such as silicon oxide, is formed. The structure of the sidewall spacer 212 can be obtained using processes known by those skilled in the art.

In step S207, a source region 216 and a drain region 217 are formed in the semiconductor substrate 200 on both sides of the gate dielectric layer 204, and the drain region 217 is located in the semiconductor substrate 200 on the side where the metal sidewall spacer 208 is located on the gate dielectric layer 204, as shown in FIG. 17. The source region 216 and the drain region 217 can be formed by methods including photolithography, ion implantation, diffusion and/or other appropriate processes, with the active region in the semiconductor substrate 200 on the side where the metal sidewall spacer 208 is located on the gate dielectric layer 204 being defined as the drain region 217.

Figure 19:
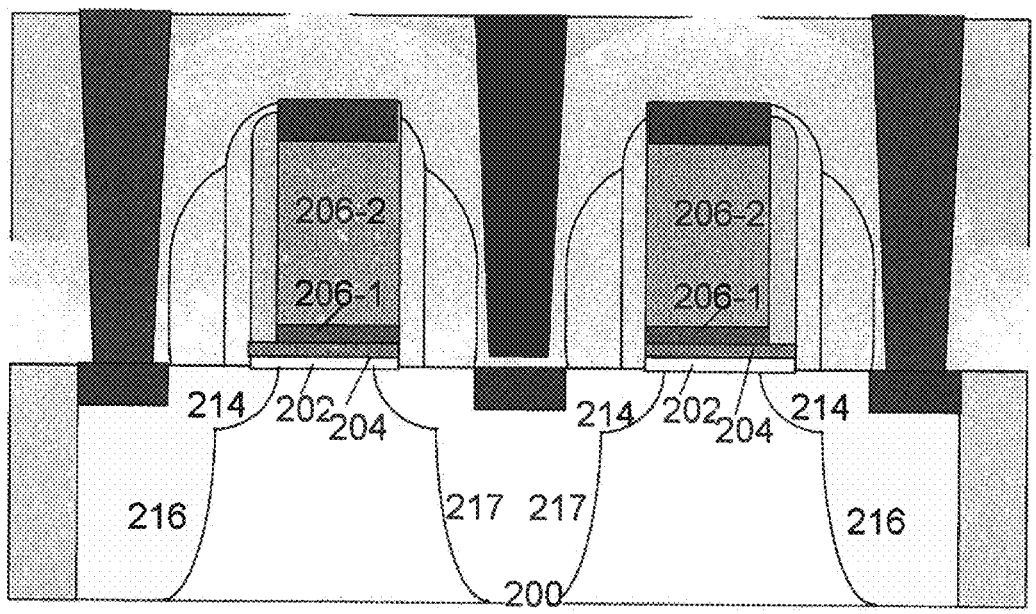

Then, subsequence processing steps are performed on the device, as shown in FIG. 19. A metal silicide layer is formed on the source region 216, the drain region 217 and the second gate layer 206-2. A source contact and a drain contact are formed on the metal silicide layer. The contacts may be formed by means of such conventional process steps as photolithography, deposition and planarization, etc., which are obvious to those skilled in the art.

The above describes the method of manufacturing a device that reduces EOT on the drain region side by means of the metal sidewall spacer on the sidewall of the gate electrode on the drain region side. According to the present invention, the metal sidewall spacer is formed of such metals as Ta on the sidewall of the gate electrode on the drain region side, and has an oxygen scavenging effect, so it effectively reduces EOT on the drain region side and increases the ability to control the short channel effect. Moreover, since EOT on the source region side is larger, the carrier mobility of the device will not be degraded.

Although the exemplary embodiments and the advantages thereof have been described in detail, it shall be understood that various changes, substitutions and modifications can be made to said embodiments without departing from the spirit of the invention and the protection scope defined by the appended claims. As for other examples, those ordinarily skilled in the art shall easily understand that the sequence of the process steps may be changed without departing from the protection scope of the present invention.

In addition, the application of the present invention is not limited to the techniques, mechanisms, fabrication, compositions, means, methods and steps in the specific embodiments described in the description. On the basis of the disclosure of the present invention, those ordinarily skilled in the art shall easily understand that the existing or to be developed techniques, mechanisms, fabrication, compositions, means, methods and steps, which have substantially the same function or achieve substantially the same effect as the respective embodiments described in the present invention, can also be used according to the present invention. Therefore, the appended claims intend to include such techniques, mechanisms, fabrication, compositions, means, methods and steps in the protection scope thereof.

What is claimed is:

1. A method of manufacturing a semiconductor device, comprising:
   A. providing a semiconductor substrate;
   B. forming a gate stack on the semiconductor substrate, the gate stack comprising an interface layer, a gate dielectric layer and a gate electrode;
   C. forming a metal sidewall spacer on the sidewall of the gate electrode on only one side thereof, said metal sidewall spacer being located on the gate dielectric layer;
   D. forming a second sidewall spacer on the sidewalls of the gate stack and the metal sidewall spacer; and
   E. forming a source region and a drain region in the semiconductor substrates on respective sides of the gate dielectric layer, the drain region being located in the semiconductor substrate on the side where the gate dielectric layer has the metal sidewall spacer thereon;
   wherein the step C of forming the metal sidewall spacer comprises: forming the metal sidewall spacer on the sidewall of the gate electrode, and forming a first sidewall spacer on the sidewall of the metal sidewall spacer; performing an angled heavy ion implantation to damage the part of the first sidewall spacer on one side; removing the first sidewall spacer and the metal sidewall spacer on the side of the damaged part of the first sidewall spacer; and removing the part of the first sidewall spacer on the other side.

2. The method according to claim 1, wherein the metal sidewall spacer is formed of one selected from a group comprising Ta, Al, and a combination thereof.

3. The method according to claim 1, wherein the thickness of the metal sidewall spacer ranges from about 20 angstroms to 50 angstroms.

4. A method of manufacturing a semiconductor device, comprising the steps:
   A. providing a semiconductor substrate;
   B. forming a gate stack on the semiconductor substrate, the gate stack comprising an interface layer, a gate dielectric layer and a gate electrode;
   C. forming a metal sidewall spacer on the sidewall on only one side of the gate electrode, and forming a first sidewall spacer on the sidewall of the metal sidewall spacer, said metal sidewall spacer and said first sidewall spacer being located on the gate dielectric layer;

D. forming a second sidewall spacer on the sidewalls of the gate stack and the first sidewall spacer;

E. forming a source region and a drain region in the semiconductor substrates on respective sides of the gate dielectric layer, the drain region being located in the semiconductor substrate on the side where the gate dielectric layer has the metal sidewall spacer thereon;

wherein the step C of forming the metal sidewall spacer and the first sidewall spacer comprises: forming a metal sidewall spacer on the sidewall of the gate electrode, and forming a first sidewall spacer on the sidewall of the metal sidewall spacer; performing an angled heavy ion implantation to damage the part of the first sidewall spacer on one side; removing the first sidewall spacer and the metal sidewall spacer on the side of the damaged part of the first sidewall spacer.

5. The method according to claim 4, wherein the metal sidewall spacer is formed of one selected from a group comprising Ta, Al, and a combination thereof.

6. The method according to claim 4, wherein the thickness of the metal sidewall spacer ranges from about 20 angstroms to 50 angstroms.

7. A method of manufacturing a common-source semiconductor device, comprising:

providing a semiconductor substrate;

forming an interface layer, a gate dielectric layer, a first gate layer and a sacrifice layer in this order on the semiconductor substrate, and performing photolithography on the sacrifice layer;

forming a second gate layer on the sidewall of the sacrifice layer, and the second gate layer being located on the first gate layer;

forming a metal sidewall spacer on the sidewalls of the first and the second gate layers, the metal sidewall spacer being located on the gate dielectric layer;

removing the sacrifice layer and the part of the first gate layer thereunder as well as the parts of the gate dielectric layer and the interface layer that are not covered by the second gate layer and the metal sidewall;

forming a second sidewall spacer on the sidewalls of the metal sidewall spacer and the first and the second gate layers;

forming a source region and a drain region in the semiconductor substrates on respective sides of the gate dielectric layer, the drain region being located in the semiconductor substrate on the side where the gate dielectric layer has the metal sidewall spacer thereon.

8. The method according to claim 7, wherein the metal sidewall spacer is formed of one selected from a group comprising Ta, Al, and a combination thereof.

9. The method according to claim 7, wherein the thickness of the metal sidewall spacer ranges from about 20 angstroms to 50 angstroms.

* * * * *